(12) United States Patent
Jeon et al.

(10) Patent No.: US 11,574,976 B2
(45) Date of Patent: Feb. 7, 2023

(54) DISPLAY DEVICE

(71) Applicant: Samsung Display Co., LTD., Yongin-si (KR)

(72) Inventors: Youngjae Jeon, Hwaseong-si (KR); Woogeun Lee, Suwon-si (KR); Jong-In Kim, Seoul (KR); Jin-Won Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/469,269

(22) Filed: Sep. 8, 2021

(65) Prior Publication Data

US 2022/0216284 A1 Jul. 7, 2022

(30) Foreign Application Priority Data

Jan. 4, 2021 (KR) .................. 10-2021-0000569

(51) Int. Cl.
*G09G 3/3233* (2016.01)
*H01L 27/32* (2006.01)
(Continued)

(52) U.S. Cl.
CPC ....... *H01L 27/3262* (2013.01); *G09G 3/3233* (2013.01); *H01L 27/3276* (2013.01); *G09G 3/3266* (2013.01); *G09G 3/3275* (2013.01); *G09G 2300/043* (2013.01); *G09G 2300/0426* (2013.01); *G09G 2300/0819* (2013.01);
(Continued)

(58) Field of Classification Search
CPC ............. H01L 27/3262; H01L 27/3276; H01L 27/124; H01L 27/3265; G09G 3/3233; G09G 3/3266; G09G 3/3275; G09G 2300/0426; G09G 2300/043; G09G 2300/0819; G09G 2300/0842; G09G 2300/0861; G09G 2320/0233; G09G 2320/045

See application file for complete search history.

(56) References Cited

U.S. PATENT DOCUMENTS

| 2016/0042694 A1* | 2/2016 | Lim ..................... G09G 3/3233 345/78 |
| 2018/0061908 A1* | 3/2018 | Shim ........................ G09G 3/32 |

(Continued)

FOREIGN PATENT DOCUMENTS

| KR | 10-2017-0027349 | 3/2017 |
| KR | 10-2018-0024909 | 3/2018 |

(Continued)

*Primary Examiner* — Stacy Khoo
(74) *Attorney, Agent, or Firm* — Kile Park Reed & Houtteman PLLC

(57) ABSTRACT

A display device includes a driving transistor on a substrate, a light emitting element disposed on the driving transistor, and a lower electrode disposed between the substrate and the driving transistor. The driving transistor includes an active pattern and a gate electrode. The active pattern includes a first region, a second region, and a channel region between the first region and the second region. The light emitting element is electrically connected to the second region of the active pattern. The lower electrode overlaps the channel region of the active pattern and provides a back bias voltage to the driving transistor.

20 Claims, 10 Drawing Sheets

(51) Int. Cl.
  *H01L 27/12*    (2006.01)
  *G09G 3/3266*   (2016.01)
  *G09G 3/3275*   (2016.01)

(52) U.S. Cl.
  CPC ............... *G09G 2300/0842* (2013.01); *G09G 2300/0861* (2013.01); *G09G 2320/0233* (2013.01); *G09G 2320/045* (2013.01); *H01L 27/124* (2013.01); *H01L 27/3265* (2013.01)

(56) References Cited

U.S. PATENT DOCUMENTS

2019/0172881 A1* 6/2019 Yoo ................... H01L 51/5237
2020/0005708 A1* 1/2020 Hwang ................ G09G 3/3258

FOREIGN PATENT DOCUMENTS

| KR | 10-1954934 | 3/2019 |
|---|---|---|
| KR | 10-2020-0075955 | 6/2020 |

* cited by examiner

DISPLAY DEVICE

CROSS-REFERENCE TO RELATED APPLICATION(S)

This application claims priority to and the benefit of Korean Patent Application No. 10-2021-0000569 under 35 U.S.C. § 119, filed in the Korean Intellectual Property Office (KIPO) on Jan. 4, 2021, the entire contents of which are incorporated herein by reference.

BACKGROUND

1. Technical Field

Embodiments of the disclosure relate to a display device.

2. Description of the Related Art

Flat panel display devices are replacing cathode ray tube display devices as display devices due to their lightweight and thin characteristics. As representative examples of such flat panel display devices, there are liquid crystal display devices and organic light emitting element display devices.

Each of pixels included in a display device may include a light emitting element and a driving transistor to drive the light emitting element. As a driving time of the driving transistor increases, the driving transistor may be degraded (e.g., by being burned in). In this case, due to a threshold voltage variation of the driving transistor, a driving current provided to the light emitting element may be reduced, so that a luminance of the pixel may be reduced. In addition, a luminance deviation between the pixels may occur according to a degree of degradation of each of the pixels, so that a display quality of the display device may be decreased.

SUMMARY

Embodiments of the disclosure provide a display device with improved display quality.

Additional features of the disclosure will be set forth in the description which follows, and in part will be apparent from the description, or may be learned by practice of the disclosure.

A display device according to an embodiment may include a driving transistor disposed on a substrate, a light emitting element disposed on the driving transistor, and a lower electrode disposed between the substrate and the driving transistor. The driving transistor may include an active pattern and a gate electrode. The active pattern may include a first region, a second region, and a channel region between the first region and the second region. The light emitting element may be electrically connected to the second region of the active pattern. The lower electrode may overlap the channel region of the active pattern and may provide a back bias voltage to the driving transistor.

In an embodiment, the display device may further include a first power line disposed between the substrate and the driving transistor. The first power line may provide a high power voltage to the driving transistor.

In an embodiment, the first power line may overlap the first region of the active pattern and may be electrically connected to the first region of the active pattern.

In an embodiment, the lower electrode and the first power line may be in a same layer.

In an embodiment, the display device may further include a second power line disposed between the substrate and the driving transistor and may provide a low power voltage to the driving transistor.

In an embodiment, the lower electrode and the second power line may be in a same layer.

In an embodiment, the display device may further include a connection pattern electrically connecting the lower electrode and the second power line. The back bias voltage may be the low power voltage.

In an embodiment, the low power voltage may be adjusted based on a threshold voltage variation of the driving transistor.

In an embodiment, the display device may further include a first capacitor electrode, the first capacitor electrode and the gate electrode being in a same layer, and a second capacitor electrode disposed on the first capacitor electrode. The second capacitor electrode may overlap the first capacitor electrode and may electrically connect the second region of the active pattern and the light emitting element. The connection pattern and the second capacitor electrode may be in a same layer.

In an embodiment, the display device may further include a compensation line disposed between the substrate and the driving transistor. The compensation line may be electrically connected to the lower electrode and may provide a compensation voltage to the lower electrode. The back bias voltage may be the compensation voltage.

In an embodiment, the low compensation voltage may be adjusted based on a threshold voltage variation of the driving transistor.

In an embodiment, the display device may further include a connection pattern electrically connecting the lower electrode and the compensation line.

In an embodiment, the display device may further include a first capacitor electrode, the first capacitor electrode and the gate electrode being in a same layer and a second capacitor electrode disposed on the first capacitor electrode. The second capacitor electrode may overlap the first capacitor electrode and may electrically connect the second region of the active pattern and the light emitting element. The connection pattern and the second capacitor electrode may be in a same layer.

In an embodiment, the display device may further include a data line disposed between the substrate and the driving transistor. The data line may provide a data voltage to the driving transistor.

In an embodiment, the lower electrode and the data line may be in a same layer.

A display device according to an embodiment may include a plurality of pixels, a scan driver, a data driver, a sensing circuit, and a controller. Each of the plurality of pixels may include a light emitting element and a driving transistor. The driving transistor may generate a driving current to drive the light emitting element. The scan driver may provide scan signals to the plurality of pixels. The data driver may provide data voltages to the plurality of pixels. The sensing circuit may measure a threshold voltage of the driving transistor of each of the plurality of pixels. The controller may control the scan driver, the data driver, and the sensing circuit. The controller may perform a first compensation for concurrently compensating for the threshold voltage of the driving transistor of each of the plurality of pixels. The first compensation may include adjusting a back bias voltage concurrently provided to the driving transistor of each of the plurality of pixels based on a representative value of a measured threshold voltage of the driving transistor of each of the plurality of pixels. The controller may perform a second compensation for respectively compensating for the threshold voltage of the driving transistor of each of the plurality of pixels.

In an embodiment, the representative value may be an average value, a maximum value, or a minimum value of the measured threshold voltage of the driving transistor of each of the plurality of pixels.

In an embodiment, the back bias voltage may be a low power voltage.

In an embodiment, the back bias voltage may be a compensation voltage.

In an embodiment, the second compensation may include respectively adjusting the data voltages respectively provided to the plurality of pixels based on the measured threshold voltage of the driving transistor of each of the plurality of pixels and adjusted back bias voltage.

The display device according to embodiments may concurrently compensate for the threshold voltages of the driving transistors for all of the pixels included in the display panel by adjusting the back bias voltage concurrently provided to the driving transistors. The display device may respectively compensate for the threshold voltages of the driving transistors for each of the pixels included in the display panel by correcting the data voltage based on a result of the previously performed compensation and the threshold voltage of each of the driving transistors. Therefore, a compensation margin of the threshold voltages of the driving transistors may be improved, so that the display quality of the display device may be improved.

It is to be understood that both the foregoing general description and the following detailed description are explanatory and are intended to provide further explanation of the disclosure.

BRIEF DESCRIPTION OF THE DRAWINGS

The accompanying drawings, which are included to provide a further understanding of the disclosure and are incorporated in and constitute a part of this specification, illustrate embodiments of the disclosure, and together with the description serve to explain the disclosure.

DETAILED DESCRIPTION OF THE EMBODIMENTS

Illustrative, non-limiting embodiments will be more clearly understood from the following detailed description in conjunction with the accompanying drawings.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 1:
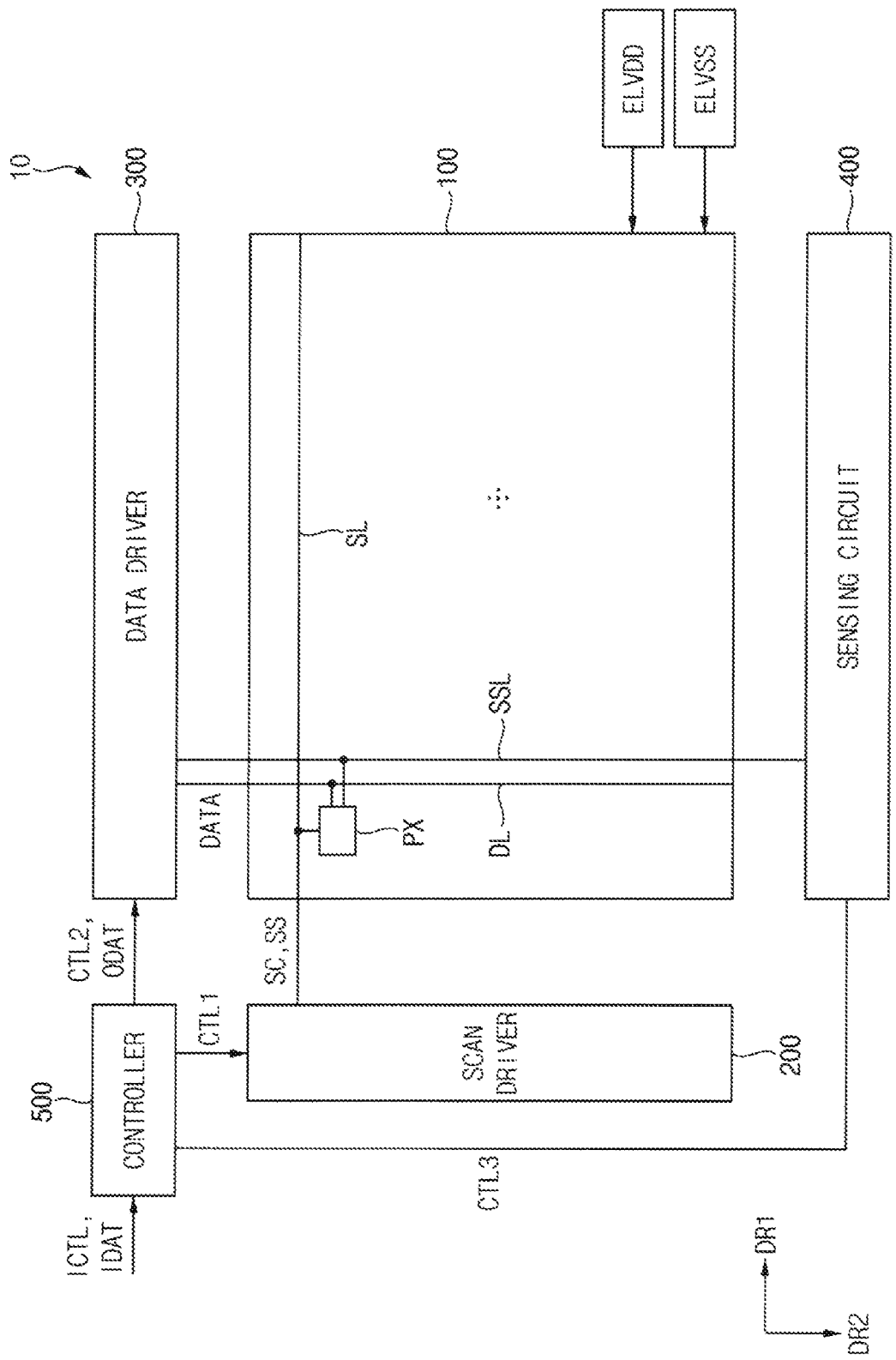
FIG. 1 is a block diagram schematically illustrating a display device according to embodiments.

FIG. 1 is a block diagram schematically illustrating a display device according to embodiments.

Referring to FIG. 1, a display device 10 according to an embodiment may include a display panel 100, a scan driver 200, a data driver 300, a sensing circuit 400, a power supply, and a controller 500.

The display panel 100 may display an image. Pixels PX may be disposed in the display panel 100. For example, the pixels PX may be arranged in a matrix form in a first direction DR1 and a second direction DR2 intersecting the first direction DR1. For example, the second direction DR2 may be perpendicular to the first direction DR1.

Each of the pixels PX may be electrically connected to a scan line SL, a data line DL, a sensing line SSL, a first power line, and a second power line. Each of the pixels PX may receive a voltage and a signal through the above-described lines. As each of the pixels PX emits light based on the voltage and the signal, the image may be displayed on the display panel 100.

The scan driver 200 may generate a scan signal based on a first control signal CTL1 provided from the controller 500. For example, the first control signal CTL1 may include a vertical start signal, a clock signal, and/or the like. The scan signal may include a first scan signal SC and a second scan signal SS. The scan signal may be provided to the pixels PX through the scan lines SL.

In an embodiment, the scan driver 200 may be integrated in a peripheral portion of the display panel 100. In another embodiment, the scan driver 200 may be implemented with one or more scan integrated circuits (ICs). The scan integrated circuits may be mounted directly on the display panel 100 in a chip on glass (COG) manner or a chip on plastic (COP) manner, or may be coupled to the display panel 100 in a chip on film (COF) manner.

The data driver 300 may generate a data voltage DATA based on a second control signal CTL2 and an output image data ODAT provided from the controller 500. For example, the second control signal CTL2 may include an output data enable signal, a horizontal start signal, a load signal, and/or the like. The data voltage DATA may be provided to the pixels PX through the data lines DL.

In an embodiment, the data driver 300 may be implemented with one or more data ICs. The data ICs may be mounted directly on the display panel 100 in the COG manner or the COP manner, or may be coupled to the display panel 100 in the COF manner.

The sensing circuit 400 may measure threshold voltages of driving transistors (e.g., a driving transistor T1 of FIG. 2) respectively included in the pixels PX based on a third control signal CTL3 provided from the controller 500. For example, the sensing circuit 400 may measure the threshold voltage of the driving transistor for each of the pixels PX (or each of pixel blocks preset to include at least two pixels PX). Accordingly, a threshold voltage variation indicating a degree of degradation of each of the driving transistors (e.g., a degree of degradation of each of the pixels PX) included in the display panel 100 may be measured for each of the pixels PX (or each of the pixel blocks). For example, the sensing circuit 400 may provide an initialization voltage or a reference voltage to the pixels PX. The initialization voltage or the reference voltage may be provided to the pixels PX through the sensing line SSL.

In an embodiment, as illustrated in FIG. 1, the data driver 300 and the sensing circuit 400 may be separately configured. In another embodiment, the data driver 300 and the sensing circuit 400 may be integrally configured (or integral with each other).

The power supply may provide a high power voltage ELVDD and a low power voltage ELVSS to the pixels PX. The high power voltage ELVDD may be provided to the pixels PX through the first power line. The low power voltage ELVSS may be provided to the pixels PX through the second power line. The low power voltage ELVSS may be less than the high power voltage ELVDD.

The controller 500 may generate the first control signal CTL1, the second control signal CTL2, and the output image data ODAT based on an input image data IDAT and an input control signal ICTL provided from an external device. For example, the input image data IDAT may be RGB data including red image data, green image data, and blue image data. The input control signal ICTL may include a master clock signal and an input data enable signal. The input control signal ICTL may further include a vertical synchronization signal and a horizontal synchronization signal.

In an embodiment, the controller 500 may calculate a representative value for the display panel 100 based on the threshold voltages of the driving transistors measured for each of the pixels PX by the sensing circuit 400. For example, the representative value may be an average value, a maximum value, or a minimum value of the threshold voltages of the driving transistors included in the display panel 100.

The controller 500 may adjust a back bias voltage provided (e.g., applied) to the pixels PX based on a difference between the representative value and a reference threshold voltage. For example, the back bias voltage may be concurrently provided to all of the pixels PX included in the display panel 100. The back bias voltage may be provided to each of the driving transistors respectively included in the pixels PX. For example, by adjusting the back bias voltage, the controller 500 may concurrently compensate for the threshold voltages of the driving transistors for all of the pixels PX included in the display panel 100 (e.g., a first compensation). For example, the back bias voltage may be the low power voltage ELVSS. For another example, the back bias voltage may be a compensation voltage.

In an embodiment, the controller 500 may generate the output image data ODAT based on the input image data IDAT, the representative value (or the adjusted back bias voltage), and the threshold voltages of the driving transistors measured by the sensing circuit 400. The data driver 300 may generate the data voltage DATA based on the output image data ODAT. For example, the degree of degradation of each of the driving transistors and a result of the first compensation performed for all of the pixels PX included in the display panel 100 may be reflected in the generated data voltage DATA. In other words, the threshold voltage variation of each of the driving transistors and a degree of compensation of the threshold voltage of each of the driving transistors compensated for by adjusting the back bias voltage may be reflected in the generated data voltage DATA. For example, the data voltages DATA respectively provided to the pixels PX may be different from each other according to the degree of degradation of each of the driving transistors. For example, by generating the output image data ODAT based on the input image data IDAT, the degree of degradation of each of the driving transistors, and the result of the first compensation, the controller 500 may respectively compensate for the threshold voltages of the driving transistors for each of the pixels PX included in the display panel 100 (e.g., a second compensation).

Figure 2:
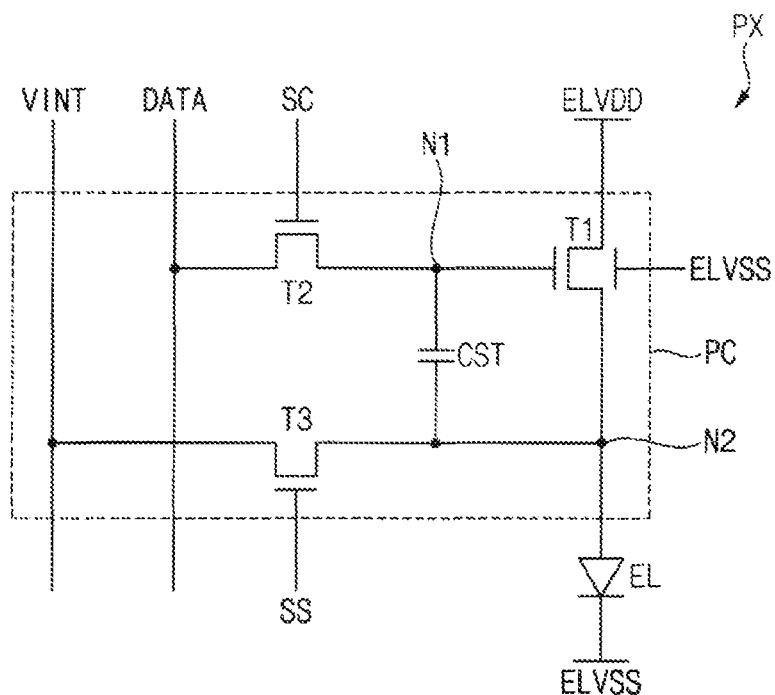
FIG. 2 is an equivalent circuit diagram schematically illustrating a pixel according to an embodiment.

FIG. 2 is an equivalent circuit diagram schematically illustrating a pixel according to an embodiment.

Referring to FIGS. 1 and 2, in an embodiment, each of the pixel PX may include a pixel circuit PC and a light emitting element EL. The pixel circuit PC may provide a driving current to the light emitting element EL. The light emitting element EL may emit light based on the driving current provided from the pixel circuit PC. The pixel circuit PC may include at least one transistor and at least one capacitor to generate the driving current.

In an embodiment, the pixel circuit PC may include a first transistor T1, a second transistor T2, a third transistor T3, and a storage capacitor CST. For example, each of the first to third transistors T1, T2, and T3 may be implemented as an N-type transistor or a P-type transistor.

The first transistor T1 may include a first gate electrode, a first electrode, and a second electrode. The first gate electrode of the first transistor T1 may be electrically connected to a first node N1. The first electrode of the first transistor T1 may be electrically connected to the first power line, and may receive the high power voltage ELVDD. The second electrode of the first transistor T1 may be electrically connected to the second node N2. The first transistor T1 may be turned on or off in response to a voltage applied to the first node N1. In case that the first transistor T1 is turned on, the first transistor T1 may generate the driving current based on the data voltage DATA and the high power voltage ELVDD. The driving current may be provided to the light emitting element EL through the second node N2, and the light emitting element EL may be driven by the driving current. For example, the first transistor T1 may be referred to as a driving transistor.

In an embodiment, the first transistor T1 may further include a second gate electrode. The second gate electrode of the first transistor T1 may receive the back bias voltage. The back bias voltage may be provided to the first transistor T1 to compensate for a threshold voltage of the first transistor T1. For example, the second gate electrode of the first transistor T1 may be electrically connected to the second power line, and may receive the low power voltage ELVSS. For example, the back bias voltage may be the low power voltage ELVSS.

The second transistor T2 may include a gate electrode, a first electrode, and a second electrode. The gate electrode of the second transistor T2 may be electrically connected to the scan line SL. The first electrode of the second transistor T2 may be electrically connected to the data line DL and may receive the data voltage DATA. The second electrode of the second transistor T2 may be electrically connected to the first node N1. The second transistor T2 may be turned on or off in response to the first scan signal SC. In case that the second transistor T2 is turned on, the data voltage DATA may be provided to the first node N1. For example, the second transistor T2 may be referred to as a switching transistor.

The third transistor T3 may include a gate electrode, a first electrode, and a second electrode. The gate electrode of the third transistor T3 may be electrically connected to the scan line SL. The first electrode of the third transistor T3 may be connected to the second node N2. The second electrode of the third transistor T3 may be connected to the sensing line SSL. The third transistor T3 may be turned on or off in response to the second scan signal SS. In case that the third transistor T3 is turned on, the driving current flowing through the second node N2 may be transferred to the sensing line SSL or the initialization voltage VINT may be provided to the second node N2. For example, the third transistor T3 may be referred to as a sensing transistor or an initialization transistor.

The storage capacitor CST may include a first electrode and a second electrode. The first electrode of the storage capacitor CST may be electrically connected to the first node N1. The second electrode of the storage capacitor CST may be electrically connected to the second node N2. The storage capacitor CST may store the data voltage DATA provided through the second transistor T2.

The light emitting element EL may include a first electrode and a second electrode. The first electrode of the light emitting element EL may be connected to the second node N2. The second electrode of the light emitting element EL may be connected to the second power line, and may receive the low power voltage ELVSS. For example, the first electrode of the light emitting element EL may be an anode electrode, and the second electrode of the light emitting element EL may be a cathode electrode.

Figure 10:
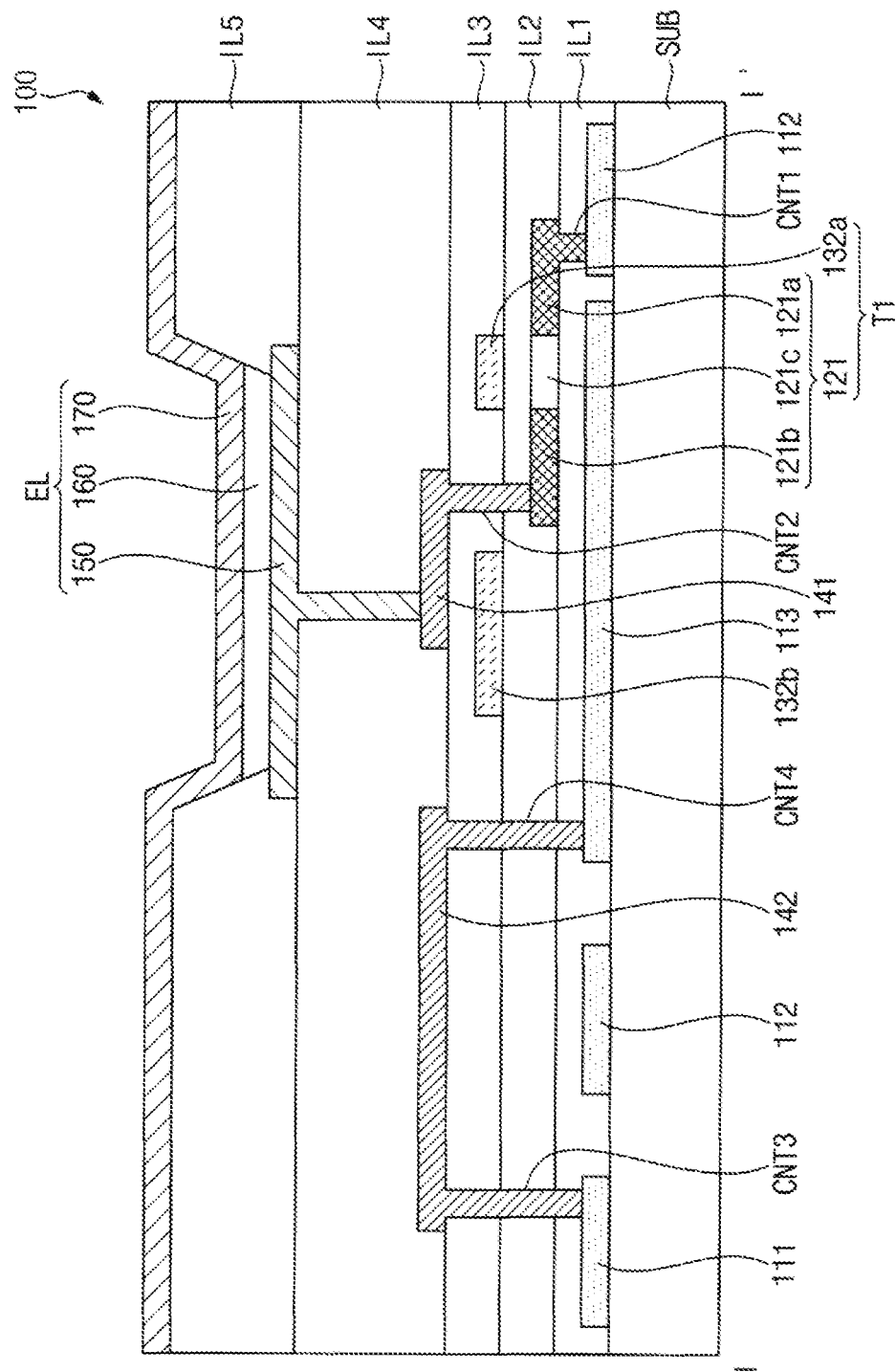
FIG. 10 is a schematic cross-sectional view taken along line I-I' of FIG. 9.

FIGS. 3 to 9 are layout views schematically illustrating a display panel including the pixel of FIG. 2. FIG. 10 is a schematic cross-sectional view taken along line I-I' of FIG. 9. FIGS. 3 to 9 may correspond to the pixel circuit PC of FIG. 2. Although a pixel PX is illustrated in FIGS. 3 to 9, the pixels PX may be arranged in the matrix form in the first direction DR1 and the second direction DR2 in the display panel 100.

Referring to FIGS. 1 to 10, the display panel 100 according to an embodiment may include a substrate SUB, a first conductive layer 110, an active layer 120, a second conductive layer 130, a third conductive layer 140, and the light emitting element EL. The light emitting element EL may include a pixel electrode 150, an emission layer 160, and a common electrode 170.

The substrate SUB may be an insulating substrate formed of a transparent or non-transparent material. In an embodiment, the substrate SUB may include glass. In this case, the display panel 100 may be a rigid display panel. In another embodiment, the substrate SUB may include plastic. In this case, the display panel 100 may be a flexible display panel.

The first conductive layer 110 may be disposed on the substrate SUB. The first conductive layer 110 may include a conductive material. For example, the first conductive layer 110 may include a metal, an alloy, a conductive metal nitride, a conductive metal oxide, a doped oxide semiconductor, a doped silicon semiconductor, and/or the like.

The first conductive layer 110 may include a first power line 112, a second power line 111, a first electrode 113, first to third data lines 114a, 114b, and 114c, and a sensing line 115. The first power line 112, the second power line 111, the first to third data lines 114a, 114b, and 114c, and the sensing line 115 may respectively correspond to the first power line, the second power line, the data line DL, and the sensing line SSL described above with reference to FIG. 1.

Figure 3:
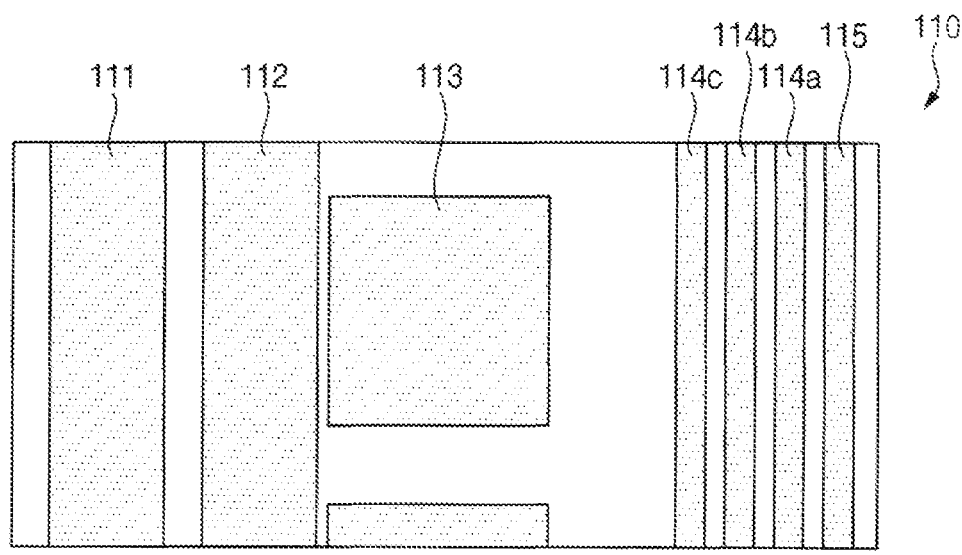
FIGS. 3 to 9 are layout views schematically illustrating a display panel including the pixel of FIG. 2.
Figure 4:
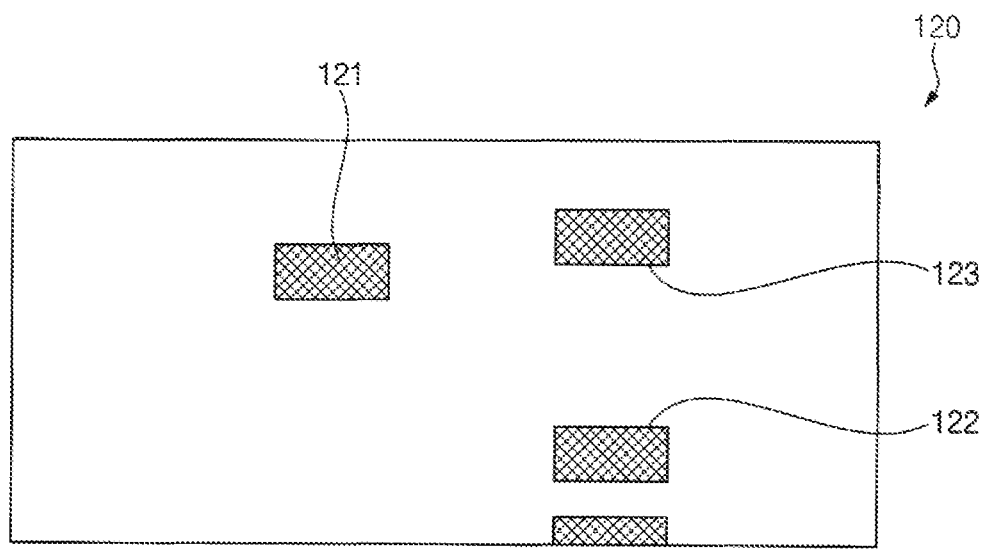
Figure 5:
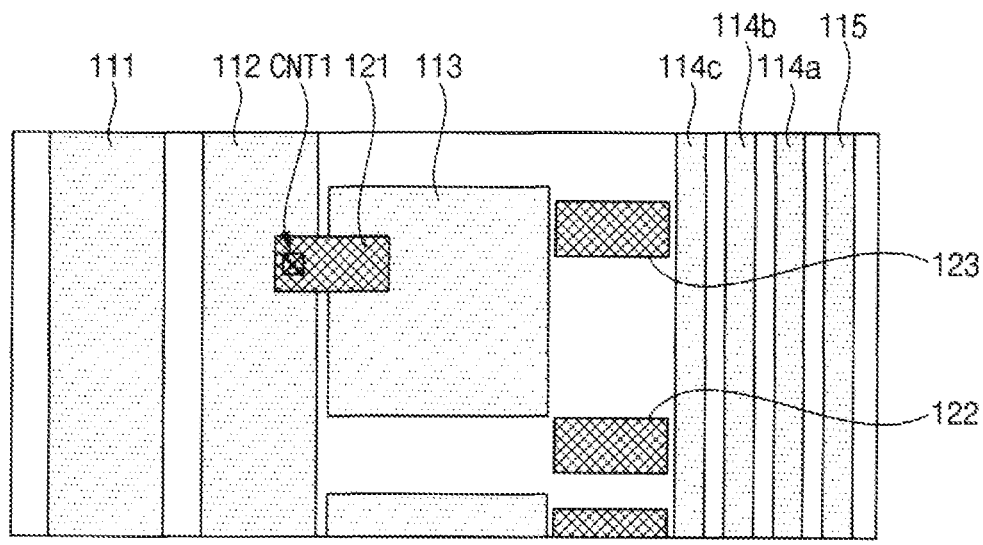
Figure 6:
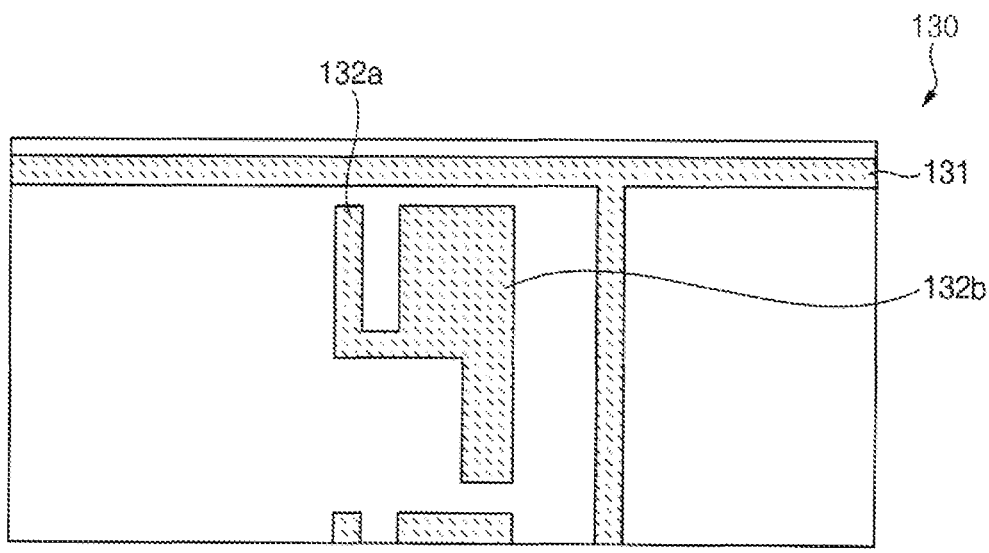
Figure 7:
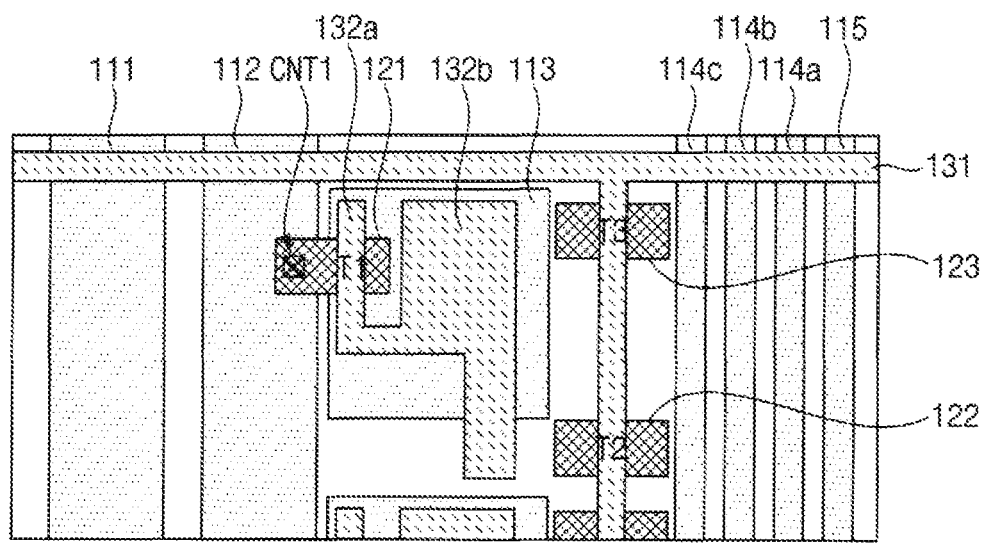
Figure 7:
Figure 8:
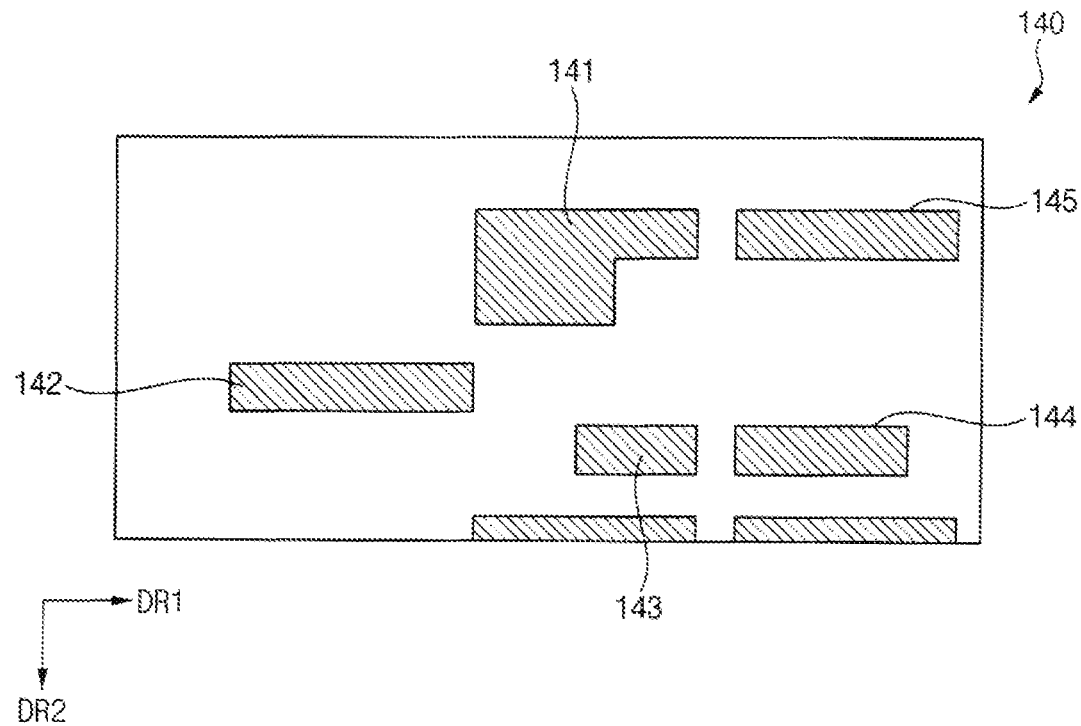
Figure 9:
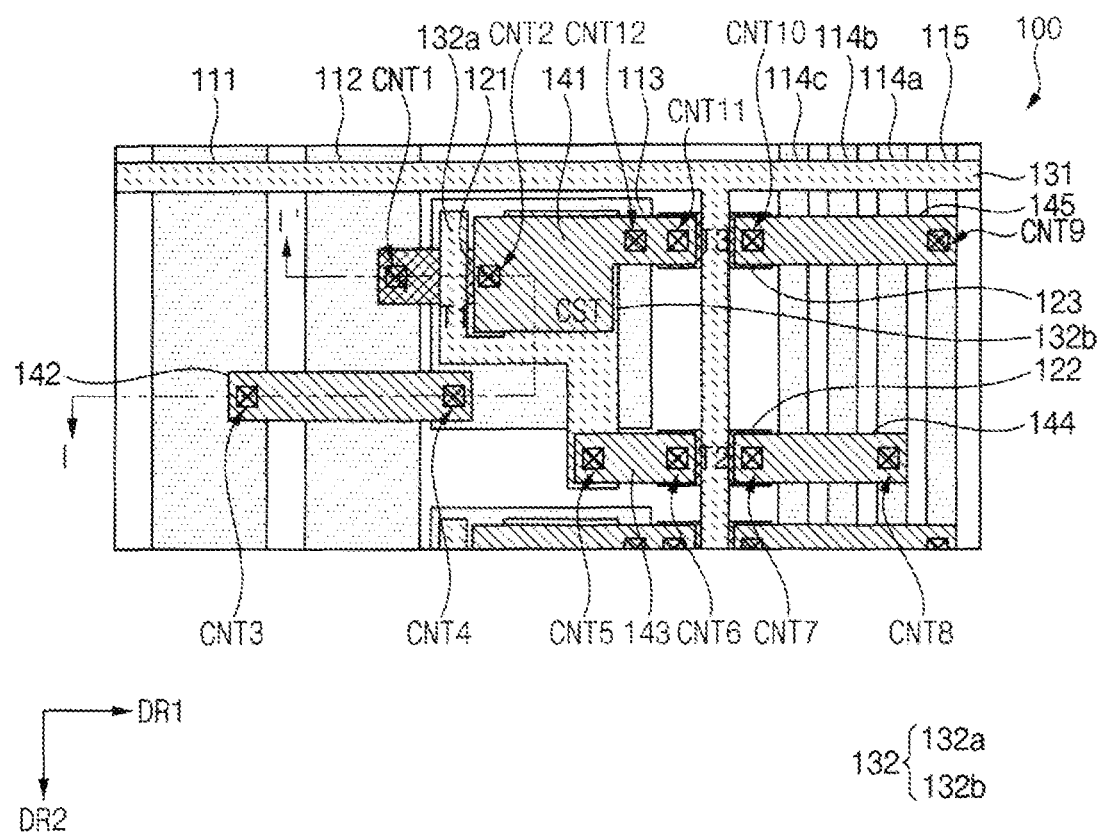

In an embodiment, each of the first power line 112, the second power line 111, the first to third data lines 114a, 114b, and 114c, and the sensing line 115 may extend in the second direction DR2, and may be spaced apart from each other in the first direction DR1. The first electrode 113 may be disposed between the first power line 112 and the first to third data lines 114a, 114b, and 114c. For example, as illustrated in FIG. 3, the first power line 112 may be disposed between the second power line 111 and the first electrode 113. For another example, the second power line 111 may be disposed between the first power line 112 and the first electrode 113.

In an embodiment, a buffer layer may be disposed between the substrate SUB and the first conductive layer 110. The buffer layer may prevent or reduce penetration of foreign substances such as oxygen or moisture through the substrate SUB to an upper portion of the substrate SUB. The buffer layer may provide a flat upper surface on the substrate SUB. The buffer layer may include an inorganic insulating material such as silicon oxide, silicon nitride, and/or silicon oxynitride. In another embodiment, the buffer layer may be omitted.

The active layer 120 may be disposed on the first conductive layer 110. The active layer 120 may include an oxide semiconductor, a silicon semiconductor, or the like. For example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include amorphous silicon, polycrystalline silicon, or the like.

A first insulating layer IL1 may be disposed between the first conductive layer 110 and the active layer 120. The first insulating layer IL1 may include an inorganic insulating material.

The active layer 120 may include a first active pattern 121, a second active pattern 122, and a third active pattern 123. The first active pattern 121 may be a channel of the first transistor T1, the second active pattern 122 may be a channel of the second transistor T2, and the third active pattern 123 may be a channel of the third transistor T3. Each of the first to third active patterns 121, 122, and 123 may include a first region, a second region, and a channel region between the first region and the second region.

The first active pattern 121 may include a first region 121a, a second region 121b, and a channel region 121c between the first region 121a and the second region 121b. The first region 121a of the first active pattern 121 may overlap the first power line 112. The first region 121a of the first active pattern 121 may be electrically connected to the first power line 112 through a first contact hole CNT1. Accordingly, the first transistor T1 may be electrically connected to the first power line 112, and may receive the high power voltage ELVDD through the first power line 112. The channel region 121c of the first active pattern 121 may overlap the first electrode 113. Accordingly, the back bias voltage (e.g., the low power voltage ELVSS) may be provided to the first transistor T1 through the first electrode 113.

The second conductive layer 130 may be disposed on the active layer 120. The second conductive layer 130 may include a conductive material. For example, the second conductive layer 130 may include molybdenum (Mo), copper (Cu), and/or the like.

A second insulating layer IL2 may be disposed between the active layer 120 and the second conductive layer 130. The second insulating layer IL2 may include an inorganic insulating material.

The second conductive layer 130 may include a scan line 131 and a second electrode 132. The scan line 131 may correspond to the scan line SL described above with reference to FIG. 1. The scan line 131 may extend in the first direction DR1, and may include a protrusion protruding in the second direction DR2. The second active pattern 122 and a portion of the protrusion overlapping the second active pattern 122 may form the second transistor T2. The third active pattern 123 and a portion of the protrusion overlapping the third active pattern 123 may form the third transistor T3.

The second electrode 132 may be disposed on the first electrode 113 and the first active pattern 121, and may overlap the first electrode 113. In an embodiment, the second electrode 132 may include a first portion 132a and a second portion 132b. The first portion 132a may overlap the first active pattern 121 (e.g., the channel region 121c of the first active pattern 121) in a plan view. The second portion 132b may be spaced apart from (e.g., may not overlap) the first active pattern 121 in a plan view. The first active pattern 121 and the first portion 132a of the second electrode 132 overlapping the first active pattern 121 may form the first transistor T1.

The first electrode 113 may be disposed under the first transistor T1. For example, the first electrode 113 may be disposed between the substrate SUB and the first transistor T1. For example, the first electrode 113 may be referred to as a lower electrode. The first electrode 113 may correspond to the second gate electrode of the first transistor T1. For example, the back bias voltage (e.g., the low power voltage ELVSS) may be provided to the first transistor T1 through the first electrode 113.

In an embodiment, the first power line 112, the second power line 111, the first to third data lines 114a, 114b, and 114c, and the sensing line 115 may disposed under the first transistor T1. For example, the first power line 112, the second power line 111, the first to third data lines 114a, 114b, and 114c, and the sensing line 115 may be disposed between the substrate SUB and the first transistor T1.

The third conductive layer 140 may be disposed on the second conductive layer 130. The third conductive layer 140 may include a conductive material. For example, the third conductive layer 140 may include aluminum (Al), titanium (Ti), copper (Cu), and/or the like. In an embodiment, the third conductive layer 140 may have a multi-layered structure in which a titanium layer, an aluminum layer, and a titanium layer are stacked.

A third insulating layer IL3 may be disposed between the second conductive layer 130 and the third conductive layer 140. The third insulating layer IL3 may include an inorganic insulating material.

The third conductive layer 140 may include a third electrode 141, a first connection pattern 142, a second connection pattern 143, a third connection pattern 144, and a fourth connection pattern 145. The third electrode 141 may be disposed on the second electrode 132. The third electrode 141 may overlap the second portion 132b of the second electrode 132 in a plan view, and may be spaced apart from (e.g., may not overlap) the first portion 132a of the second electrode 132. The second portion 132b of the second electrode 132 and a portion of the third electrode 141 overlapping the second portion 132b may form the storage capacitor CST. For example, the second portion 132b of the second electrode 132 may be referred to as a first capacitor electrode. The portion of the third electrode 141 overlapping the second portion 132b of the second electrode 132 may be referred to as a second capacitor electrode. Another portion of the third electrode 141 may be spaced apart from (e.g., may not overlap) the second electrode 132 in a plan view, and may overlap the second region 121b of the first active pattern 121. The another portion of the third electrode 141 may be electrically connected to the second region 121b of the first active pattern 121 through a second contact hole CNT2.

The first connection pattern 142 may extend in the first direction DR1. A first end portion of the first connection pattern 142 may overlap the second power line 111, and a second end portion of the first connection pattern 142 may overlap the first electrode 113. The first end portion of the first connection pattern 142 may be electrically connected to the second power line 111 through a third contact hole CNT3. The second end portion of the first connection pattern 142 may be electrically connected to the first electrode 113 through a fourth contact hole CNT4. For example, the first electrode 113 and the second power line 111 may be electrically connected by the first connection pattern 142. Accordingly, the low power voltage ELVSS may be provided to the first electrode 113 through the first connection pattern 142. Accordingly, the low power voltage ELVSS may be provided to the first transistor T1 as the back bias voltage.

As described above, the back bias voltage may be adjusted based on the difference between the representative value and the reference threshold voltage. For example, the back bias voltage may be adjusted based on the average value (or, the minimum value or the maximum value) of the threshold voltage variations of the first transistors T1 included in the display panel 100 (i.e., the driving transistors T1 respectively included in the pixels PX). In other words, the low power voltage ELVSS may be adjusted based on the average value of the threshold voltage variations of the first transistors T1 included in the display panel 100.

The second connection pattern 143 may be electrically connected to the second electrode 132 through a fifth contact hole CNT5, and may be electrically connected to the second active pattern 122 through a sixth contact hole CNT6. The third connection pattern 144 may be electrically connected to the second active pattern 122 through a seventh contact hole CNT7, and may be electrically connected to the first data line 114a through an eighth contact hole CNT8. The fourth connection pattern 145 may be electrically connected to the sensing line 115 through a ninth contact hole CNT9, and may be electrically connected to the third active pattern 123 through a tenth contact hole CNT10.

The third electrode 141 may be electrically connected to the third active pattern 123 through an eleventh contact hole CNT11, and may be electrically connected to the first electrode 113 through a twelfth contact hole CNT12. As described later, the third electrode 141 may be electrically connected to the pixel electrode 150 included in the light emitting element EL. As the first electrode 113 overlapping the channel region 121c of the first active pattern 121 is electrically connected to the pixel electrode 150 through the third electrode 141, a current variation rate may be reduced in a saturation region of a voltage-current characteristic graph of the first transistor T1, so that a range of a region where an output current of the first transistor T1 is constant may be increased. Therefore, in case that a source-drain voltage of the first transistor T1 is changed, the output current of the first transistor T1 may be maintained to be constant, so that an output saturation characteristic may be improved. Accordingly, a luminance deviation between the pixels PX due to the output current of the first transistor T1 may be reduced, so that a display quality of the display device 10 may be improved.

The pixel electrode 150 may be disposed on the third conductive layer 140. The pixel electrode 150 may include a conductive material. For example, the pixel electrode 150 may include silver (Ag), indium tin oxide (ITO), and/or the like. In an embodiment, the pixel electrode 150 may have a multi-layered structure in which an indium tin oxide layer, a silver layer, and an indium tin oxide layer are stacked.

A fourth insulating layer IL4 may be disposed between the third conductive layer 140 and the pixel electrode 150. The fourth insulating layer IL4 may include an inorganic insulating material and/or an organic insulating material. For example, the organic insulating material may include a photoresist, a polyacryl-based resin, a polyimide-based resin, a polyamide-based resin, a siloxane-based resin, an acryl-based resin, an epoxy-based resin, and/or the like.

The pixel electrode 150 may be electrically connected to the third electrode 141 through a contact hole. Accordingly, the pixel electrode 150 may be electrically connected to the first transistor T1 through the third electrode 141.

A fifth insulating layer IL5 may be disposed on the pixel electrode 150. The fifth insulating layer IL5 may partially cover (or overlap) the pixel electrode 150, and may be disposed on the fourth insulating layer IL4. The fifth insulating layer IL5 may have a pixel opening exposing at least a portion of the pixel electrode 150. In an embodiment, the pixel opening may expose a central portion of the pixel electrode 150, and the fifth insulating layer IL5 may cover a peripheral portion of the pixel electrode 150. The fifth insulating layer IL5 may include an organic insulating material.

The emission layer 160 may be disposed on the pixel electrode 150. The emission layer 160 may be disposed on the pixel electrode 150 exposed by the pixel opening. For example, the emission layer 160 may include at least one of an organic light emitting material and a quantum dot.

In an embodiment, the organic light emitting material may include a low molecular organic compound or a high molecular organic compound. For example, the low molecular organic compound may include copper phthalocyanine, N,N'-diphenylbenzidine, tris-(8-hydroxyquinoline)aluminum, and/or the like. The high molecular organic compound may include poly(3,4-ethylenedioxythiophene), polyaniline, poly-phenylenevinylene, polyfluorene, and/or the like.

In an embodiment, the quantum dot may include a core including a Group II-VI compound, a Group III-V compound, a Group IV-VI compound, a Group IV element, and/or a Group IV compound. In an embodiment, the quantum dot may have a core-shell structure including the core and a shell surrounding the core. The shell may serve (or function) as a protective layer for preventing the core from being chemically denatured to maintain semiconductor characteristics, and may serve as a charging layer for imparting electrophoretic characteristics to the quantum dot.

The common electrode 170 may be disposed on the emission layer 160. In an embodiment, the common electrode 170 may also be disposed on the fifth insulating layer IL5. The common electrode 170 may include a conductive material. For example, the common electrode 170 may include aluminum (Al), platinum (Pt), silver (Ag), magnesium (Mg), gold (Au), chromium (Cr), tungsten (W), titanium (Ti), and/or the like.

The pixel electrode 150, the emission layer 160, and the common electrode 170 may form the light emitting element EL. The common electrode 170 may be electrically connected to the second power line 111. For example, the light emitting element EL may receive the low power voltage ELVSS through the second power line 111.

Figure 11:
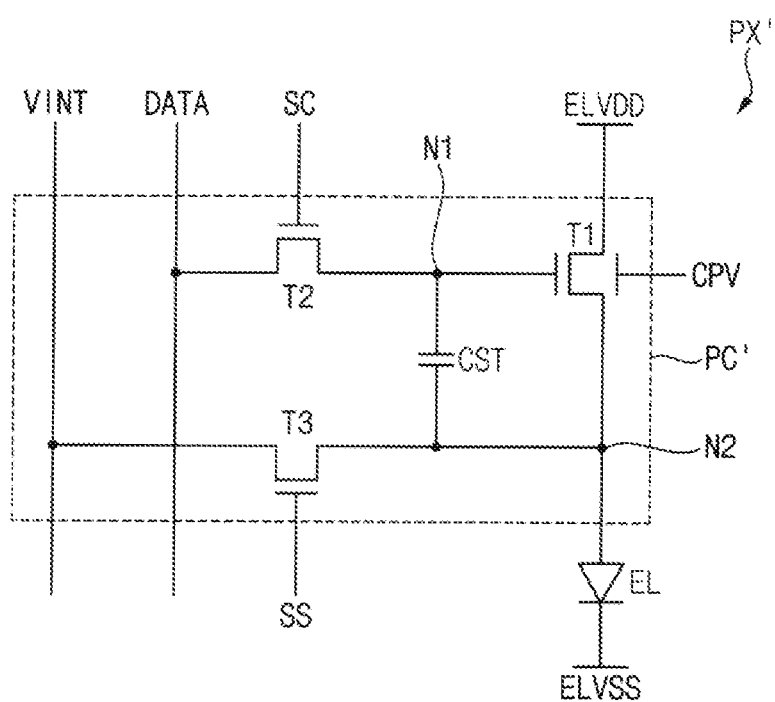
FIG. 11 is an equivalent circuit diagram schematically illustrating a pixel according to another embodiment.
Figure 12:
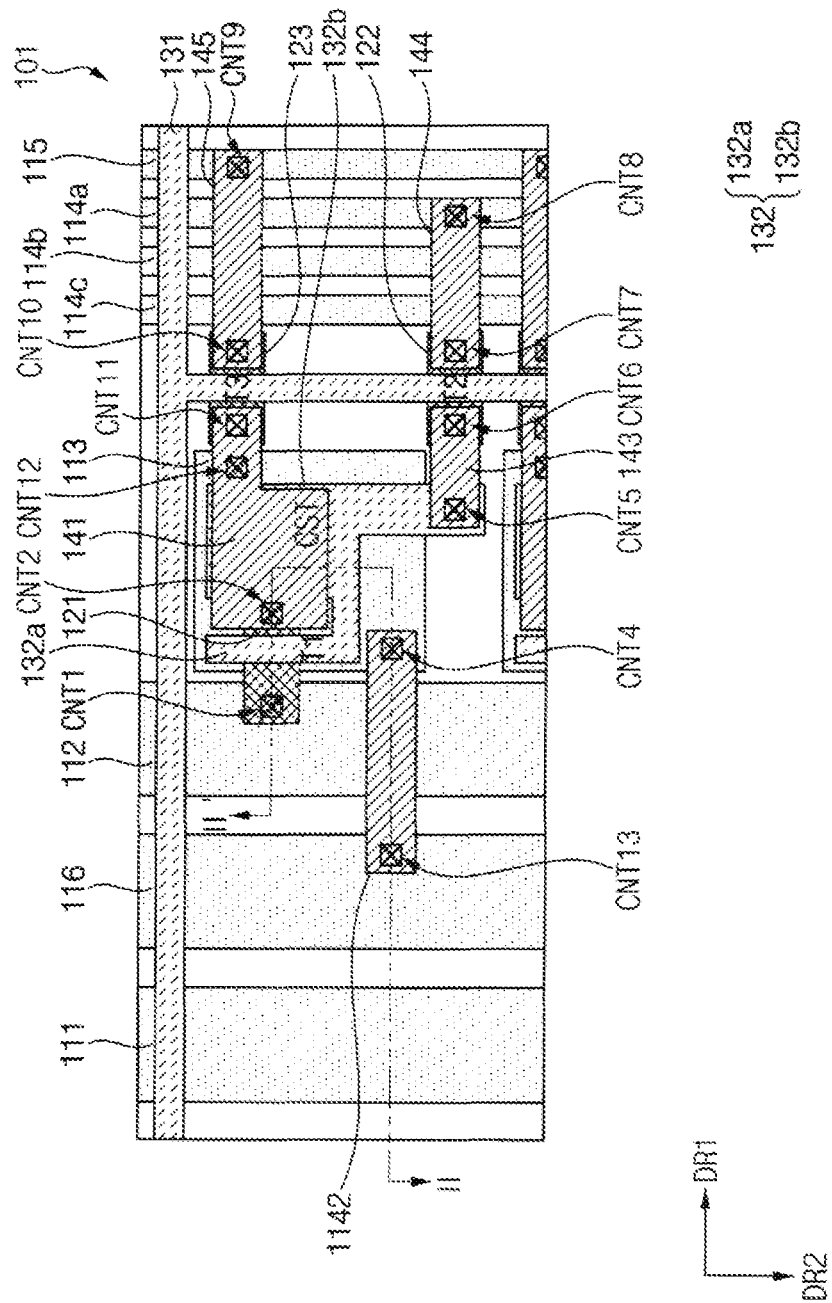
FIG. 12 is a layout view schematically illustrating a display panel including the pixel of FIG. 11.
Figure 13:
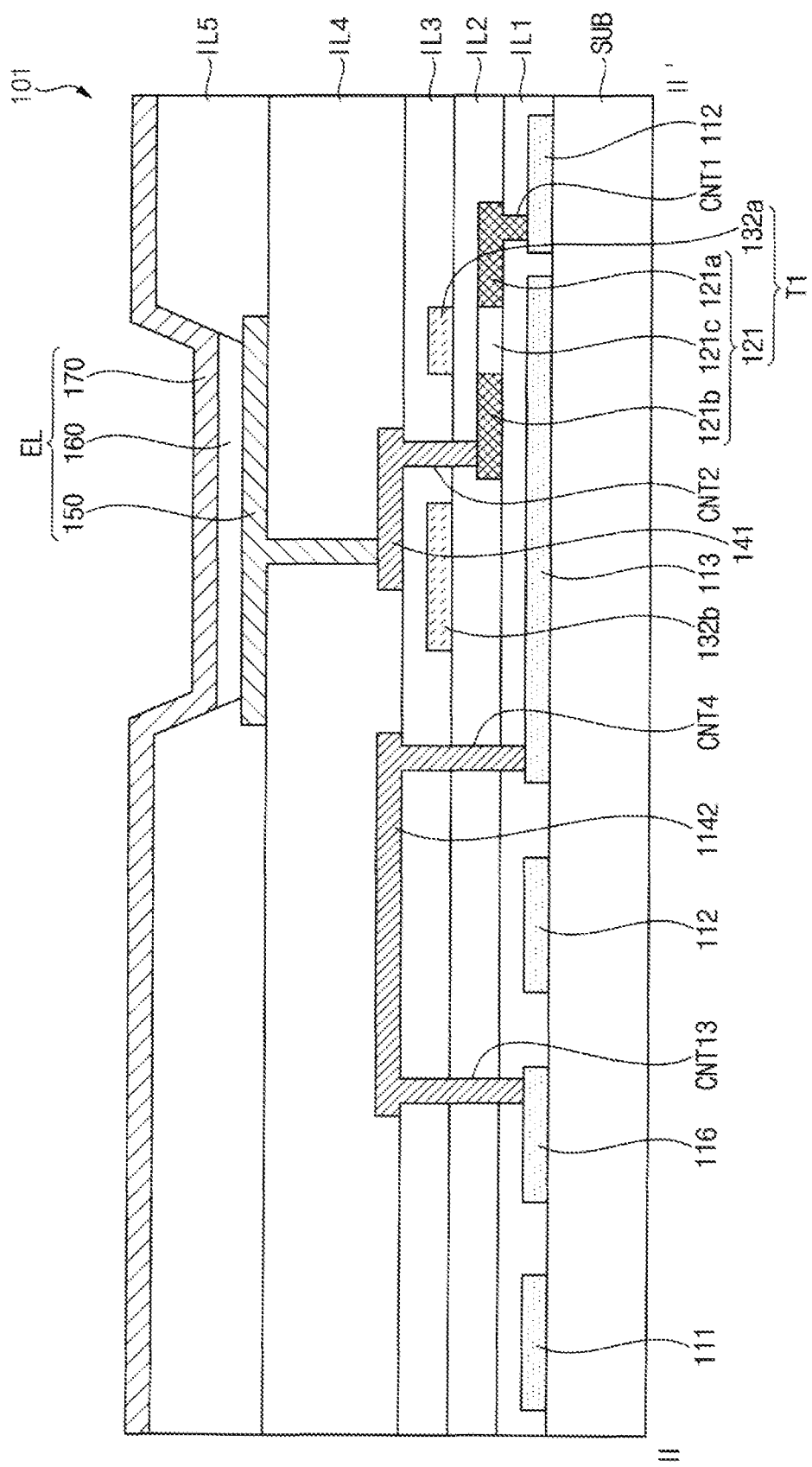
FIG. 13 is a schematic cross-sectional view taken along line II-II' of FIG. 12.

FIG. 11 is an equivalent circuit diagram schematically illustrating a pixel according to another embodiment. FIG. 12 is a layout view schematically illustrating a display panel including the pixel of FIG. 11. FIG. 13 is a schematic cross-sectional view taken along the line II-II' of FIG. 12. FIG. 12 may correspond to a pixel circuit PC' of FIG. 11. A display panel 101 according to another embodiment described with reference to FIGS. 11 to 13 may be substantially identical or similar to the display panel 100 described with reference to FIGS. 2 to 10 but may be different therefrom at least in a compensation line 116 and a first connection pattern 1142. Therefore, repetitive descriptions will be omitted or simplified.

Referring to FIGS. 1 and 11, in another embodiment, each of pixels PX' may include a pixel circuit PC' and a light emitting element EL. The pixel circuit PC' may include a first transistor T1, a second transistor T2, a third transistor T3, and a storage capacitor CST. The pixel PX' according to another embodiment described with reference to FIG. 11 may be substantially identical or similar to the pixel PX described with reference to FIG. 2 but may be different therefrom at least in a second gate electrode of the first transistor T1. Therefore, repetitive descriptions will be omitted or simplified.

The first transistor T1 may include a first gate electrode, a second gate electrode, a first electrode, and a second electrode. The second gate electrode of the first transistor T1 may receive the back bias voltage. The back bias voltage may be provided to the first transistor T1 to compensate for a threshold voltage of the first transistor T1. For example, the second gate electrode of the first transistor T1 may be electrically connected to a compensation line, and may receive a compensation voltage CPV. For example, the back bias voltage may be the compensation voltage CPV. The compensation voltage CPV may be provided separately from the high power voltage ELVDD and the low power voltage ELVSS to the second gate electrode of the first transistor T1 through the compensation line.

Referring to FIGS. 1, 11, 12, and 13, a display panel 101 according to another embodiment may include a substrate SUB, a first conductive layer, an active layer, a second conductive layer, a third conductive layer, and the light emitting element EL. The light emitting element EL may include a pixel electrode 150, an emission layer 160, and a common electrode 170.

The first conductive layer may be disposed on the substrate SUB. The active layer may be disposed on the first conductive layer. A first insulating layer IL1 may be disposed between the first conductive layer and the active layer. The second conductive layer may be disposed on the active layer. A second insulating layer IL2 may be disposed between the active layer and the second conductive layer. The third conductive layer may be disposed on the second conductive layer. A third insulating layer IL3 may be disposed between the second conductive layer and the third conductive layer. The light emitting element EL may be disposed on the third conductive layer.

The first conductive layer may include a first power line 112, a second power line 111, a first electrode 113, first to third data lines 114*a*, 114*b*, and 114*c*, a sensing line 115, and a compensation line 116. The compensation line 116 may be disposed under the first transistor T1. For example, the compensation line 116 may be disposed between the substrate SUB and the first transistor T1.

In an embodiment, the compensation line 116 may extend in the second direction DR2. For example, the compensation line 116 may be disposed between the first power line 112 and the second power line 111. For another example, the compensation line 116 may be disposed between the first electrode 113 and the first power line 112. For still another example, the compensation line 116 may be spaced apart from the first power line 112 with the second power line 111 interposed therebetween. For still another example, the compensation line 116 may be spaced apart from the first power line 112 with the first electrode 113 interposed therebetween. The compensation line 116 may receive the compensation voltage CPV from the power supply.

The third conductive layer may include a third electrode 141, a first connection pattern 1142, a second connection pattern 143, a third connection pattern 144, and a fourth connection pattern 145.

The first connection pattern 1142 may extend in the first direction DR1. A first end portion of the first connection pattern 1142 may overlap the compensation line 116, and a second end portion of the first connection pattern 1142 may overlap the first electrode 113. The first end portion of the first connection pattern 1142 may be electrically connected to the compensation line 116 through a thirteenth contact hole CNT13. The second end portion of the first connection pattern 1142 may be electrically connected to the first electrode 113 through a fourth contact hole CNT4. For example, the first electrode 113 and the compensation line 116 may be electrically connected by the first connection pattern 1142. Accordingly, the compensation voltage CPV may be provided to the first electrode 113 through the first connection pattern 1142. Accordingly, the compensation voltage CPV may be provided to the first transistor T1 as the back bias voltage.

As described above, the back bias voltage may be adjusted based on the difference between the representative value and the reference threshold voltage. For example, the back bias voltage may be adjusted based on the average value (or, the minimum value or the maximum value) of the threshold voltage variations of the first transistors T1 included in the display panel 100 (i.e., the driving transistors T1 respectively included in the pixels PX'). In other words, the compensation voltage CPV may be adjusted based on the average value of the threshold voltage variations of the first transistors T1 included in the display panel 100.

According to a conventional display device, a sensing circuit may measure threshold voltages of driving transistors respectively included in pixels. A controller may generate corrected output image data reflecting a threshold voltage variation of each of the driving transistors. For example, the display device may only respectively compensate for the threshold voltages of the driving transistors for each of the pixels included in a display panel. In this case of such a threshold voltage compensation for each of the pixels, there is a limit of a compensation margin (e.g., about 2V).

In some embodiments, the sensing circuit 400 may measure the threshold voltages of the driving transistors T1 for each of the pixels PX. The controller 500 may adjust the back bias voltage (e.g., the low power voltage ELVSS or the compensation voltage CPV) concurrently provided to the driving transistors T1 based on the representative value (e.g., the average value, the maximum value, or the minimum value) of the measured threshold voltages of the driving transistors T1. For example, the controller 500 may perform the first compensation for concurrently compensating for the threshold voltages of the driving transistors T1 for all of the pixels PX included in the display panel 100. Subsequently, the controller 500 may generate the output image data ODAT reflecting the measured threshold voltages of the driving transistors T1 and a result of the first compensation (e.g., the adjusted back bias voltage). For example, the data voltage DATA may be corrected, so that the degree of degradation of each of the driving transistors T1 (e.g., the degree of degradation of each of the pixels PX) may be individually reflected. In other words, the controller 500 may perform the second compensation for respectively compensating the threshold voltage of the driving transistor T1 for each of the pixels PX included in the display panel 100. Therefore, a compensation margin of the threshold voltages of the driving transistors T1 may be improved. Accordingly, the luminance deviation between the pixels PX may be reduced, so that the display quality of the display device 10 may be improved.

Although certain embodiments and implementations have been described herein, other embodiments and modifications will be apparent from this description. Accordingly, the disclosure are not limited to such embodiments, but rather to the broader scope of the various obvious modifications and equivalent arrangements as would be apparent to a person of ordinary skill in the art.

What is claimed is:

1. A display device comprising:
   a driving transistor disposed on a substrate, the driving transistor including an active pattern and a gate electrode, the active pattern including a first region, a second region, and a channel region between the first region and the second region;
   a light emitting element disposed on the driving transistor and electrically connected to the second region of the active pattern;
   a lower electrode disposed between the substrate and the driving transistor, overlapping the channel region of the active pattern, and providing a back bias voltage to the driving transistor; and
   a compensation line disposed between the substrate and the driving transistor, electrical connected to the lower electrode, and providing a compensation voltage to the lower electrode.

2. The display device of claim 1, further comprising a first power line disposed between the substrate and the driving transistor and providing a high power voltage to the driving transistor.

3. The display device of claim 2, wherein the first power line overlaps the first region of the active pattern and is electrically connected to the first region of the active pattern.

4. The display device of claim 2, wherein the lower electrode and the first power line are in a same layer.

5. The display device of claim 2, further comprising a second power line disposed between the substrate and the driving transistor and providing a low power voltage to the driving transistor.

6. The display device of claim 5, wherein the lower electrode and the second power line are in a same layer.

7. The display device of claim 5, further comprising a connection pattern electrically connecting the lower electrode and the second power line, and
   wherein the back bias voltage is the low power voltage.

8. The display device of claim 7, wherein the low power voltage is adjusted based on a threshold voltage variation of the driving transistor.

9. The display device of claim 7, further comprising:
   a first capacitor electrode, the first capacitor electrode and the gate electrode being in a same layer; and
   a second capacitor electrode disposed on the first capacitor electrode, overlapping the first capacitor electrode, and electrically connecting the second region of the active pattern and the light emitting element, and
   wherein the connection pattern and the second capacitor electrode are in a same layer.

10. The display device of claim 1, wherein the back bias voltage is the compensation voltage.

11. The display device of claim 10, wherein the compensation voltage is adjusted based on a threshold voltage variation of the driving transistor.

12. The display device of claim 10, further comprising a connection pattern electrically connecting the lower electrode and the compensation line.

13. The display device of claim 12, further comprising:
a first capacitor electrode, the first capacitor electrode and the gate electrode being in a same layer; and
a second capacitor electrode disposed on the first capacitor electrode, overlapping the first capacitor electrode, and electrically connecting the second region of the active pattern and the light emitting element, and
wherein the connection pattern and the second capacitor electrode are in a same layer.

14. The display device of claim 1, further comprising a data line disposed between the substrate and the driving transistor, and providing a data voltage to the driving transistor.

15. The display device of claim 14, wherein the lower electrode and the data line are in a same layer.

16. A display device comprising:
a plurality of pixels, each of the plurality of pixels including:
a light emitting element; and
a driving transistor, the driving transistor generating a driving current to drive the light emitting element;
a scan driver providing scan signals to the plurality of pixels;
a data driver providing data voltages to the plurality of pixels;
a sensing circuit measuring a threshold voltage of the driving transistor of each of the plurality of pixels; and
a controller controlling the scan driver, the data driver, and the sensing circuit, wherein
the controller performs a first compensation for concurrently compensating for the threshold voltage of the driving transistor of each of the plurality of pixels,
the controller performs a second compensation for respectively compensating for the threshold voltage of the driving transistor of each of the plurality of pixels, and
the first compensation includes adjusting a back bias voltage concurrently provided to the driving transistor of each of the plurality of pixels based on a representative value of a measured threshold voltage of the driving transistor of each of the plurality of pixels.

17. The display device of claim 16, wherein the representative value is an average value, a maximum value, or a minimum value of the measured threshold voltage of the driving transistor of each of the plurality of pixels.

18. The display device of claim 16, wherein the back bias voltage is a low power voltage.

19. The display device of claim 16, wherein the back bias voltage is a compensation voltage.

20. The display device of claim 16, wherein the second compensation includes respectively adjusting the data voltages respectively provided to the plurality of pixels based on the measured threshold voltage of the driving transistor of each of the plurality of pixels and adjusted back bias voltage.

* * * * *